(12) United States Patent
Wimpenny

(10) Patent No.: US 10,148,229 B2
(45) Date of Patent: Dec. 4, 2018

(54) PRE-DISTORTION IN RF PATH IN COMBINATION WITH SHAPING TABLE IN ENVELOPE PATH FOR ENVELOPE TRACKING AMPLIFIER

(71) Applicant: SnapTrack, Inc., San Diego, CA (US)

(72) Inventor: Gerard Wimpenny, Cambridge (GB)

(73) Assignee: SNAPTRACK, Inc., San Diego, CA (US)

( * ) Notice: Subject to any disclaimer, the term of this patent is extended or adjusted under 35 U.S.C. 154(b) by 0 days.

(21) Appl. No.: 13/742,505

(22) Filed: Jan. 16, 2013

(65) Prior Publication Data

US 2014/0028392 A1 Jan. 30, 2014

(30) Foreign Application Priority Data

Jan. 16, 2012 (GB) .................................. 1200627.6

(51) Int. Cl.
*H03F 1/26* (2006.01)
*H03F 1/32* (2006.01)
(Continued)

(52) U.S. Cl.
CPC ......... *H03F 1/3241* (2013.01); *H03F 1/0222* (2013.01); *H03F 1/0227* (2013.01);
(Continued)

(58) Field of Classification Search
CPC .................................................. H03F 1/3241
(Continued)

(56) References Cited

U.S. PATENT DOCUMENTS 6,141,541 A 10/2000 Midya et al.
6,774,719 B1 * 8/2004 Wessel et al. ................ 330/136
(Continued)

FOREIGN PATENT DOCUMENTS

CN 102299689 A 12/2011
JP 2006174418 A 6/2006
(Continued)

OTHER PUBLICATIONS

International Search Report and Written Opinion; dated Apr. 11, 2013 for corresponding PCT Application No. PCT/EP2013/050709.
(Continued)

*Primary Examiner* — Khanh V Nguyen
*Assistant Examiner* — Khiem Nguyen
(74) *Attorney, Agent, or Firm* — Patterson & Sheridan, L.L.P.

(57) ABSTRACT

There is disclosed a method of controlling an envelope tracking amplification stage comprising an envelope modulated power supply, the method comprising: determining a shaping function to be applied to an envelope signal for controlling the envelope modulated power supply in dependence on a system linearity objective in a region of operation of the amplifier in which the output power of the amplifier is dependent upon the supply voltage; and determining a pre-distortion function to be applied to an input signal to be amplified in dependence on a further linearity objective of the system, in a region of operation of the amplifier in which the output of the amplifier is dependent upon the input power to the amplifier.

7 Claims, 4 Drawing Sheets

(51) Int. Cl.
*H04L 25/02* (2006.01)
*H04L 25/03* (2006.01)
*H03F 1/02* (2006.01)

(52) U.S. Cl.
CPC ........ *H04L 25/026* (2013.01); *H04L 25/0286* (2013.01); *H04L 25/03343* (2013.01); *H03F 2200/102* (2013.01)

(58) Field of Classification Search
USPC ................. 330/149, 296, 297, 127, 136; 375/296–297; 455/114.3
See application file for complete search history.

(56) References Cited

U.S. PATENT DOCUMENTS

| | | | |
|---|---|---|---|
| 7,043,213 B2 | 5/2006 | Robinson et al. | |
| 7,091,777 B2 | 8/2006 | Lynch | |
| 7,135,918 B1 | 11/2006 | Outaleb et al. | |
| 7,706,467 B2 | 4/2010 | Kenington | |
| 7,715,811 B2* | 5/2010 | Kenington | H04B 1/0475 330/127 |
| 8,536,941 B2* | 9/2013 | Hongo | H03F 1/0244 330/127 |
| 2009/0045872 A1 | 2/2009 | Kenington | |
| 2009/0174473 A1 | 7/2009 | Woo et al. | |
| 2011/0285460 A1 | 11/2011 | Murao | |
| 2012/0326777 A1 | 12/2012 | Onishi | |

FOREIGN PATENT DOCUMENTS

| | | |
|---|---|---|
| JP | 2007511187 A | 4/2007 |
| JP | 2008527759 A | 7/2008 |
| JP | 2011010107 A | 1/2011 |
| WO | WO-2011125261 A1 | 10/2011 |
| WO | WO2011147941 A1 | 12/2011 |

OTHER PUBLICATIONS

British Search Report dated May 4, 2012, for British Application No. 1200627.6, filed on Jan. 16, 2012, (3 pages).

International Preliminary Report on Patentability; dated Jul. 31, 2014 for the corresponding PCT Application No. PCT/EP2013/050709.

* cited by examiner

PRE-DISTORTION IN RF PATH IN COMBINATION WITH SHAPING TABLE IN ENVELOPE PATH FOR ENVELOPE TRACKING AMPLIFIER

FIELD OF THE INVENTION

The invention relates to techniques for achieving efficient amplification of non-constant envelope signals. The invention particularly relates to the use of envelope tracking power supplies for amplification, incorporating shaping functions for shaping the envelope signal.

The invention particularly, but not exclusively, relates to the amplification of radio frequency (RF) signals.

DESCRIPTION OF THE RELATED ART

Many modern communication systems typically use non-constant envelope modulation techniques to achieve high spectral efficiency. To avoid spectral spreading into adjacent communication channels, high linearity radio frequency (RF) amplification is required. Traditional fixed bias amplifiers can only achieve the required linearity by 'backing off' the amplifier so that it normally operates at a power well below its peak power capability. Unfortunately, the DC to RF power conversion efficiency in this region is very low. As a consequence these designs dissipate considerable heat and reduce battery life when used in portable applications.

Maximization of battery life is of paramount importance in mobile wireless equipment for example. With most high spectral efficiency communication standards, the mobile transmitter operates at considerably less than maximum power most of the time. There are two reasons for this. Firstly, power control is generally used to reduce the average transmit power to the minimum level required for reliable communication, and secondly most emerging modulation schemes have a high peak-to-average power ratio. Hence it is important for the power amplifier to maintain high efficiency at powers significantly below maximum, where the power amplifier operates most of the time.

A known technique for increasing amplifier efficiency, "envelope tracking" (ET), uses a supply modulator to modulate the supply voltage substantially in line with the envelope of the input RF signal. To achieve highest overall efficiency, the efficiency of the supply modulator itself must be high, requiring the use of a switched mode DC-DC converter for the modulator. The design of the supply modulator is critical to the system performance of the amplifier. In addition to achieving good efficiency, the modulator must also exhibit high bandwidth, high linearity and low noise to be useful in modern communications applications which typically use high bandwidth CDMA or OFDM modulation schemes and also demand high modulation accuracy.

An improved linearization approach uses an envelope voltage to implement a voltage mapping (or shaping) function to achieve constant gain from the RF amplifier, thereby reducing the need for pre-distortion or feedback. The mapping (or shaping) function between the envelope voltage and supply voltage may use a continuous function, in which the envelope voltage may be uniquely derived from knowledge of the supply voltage.

It is an aim of the invention to provide an improved envelope tracking power amplifier arrangement in which a shaping function is used to shape the envelope signal provided to a modulated power supply in conjunction with pre-distortion in the RF path.

SUMMARY OF THE INVENTION

According to the present invention there is provided a method of controlling an envelope tracking amplification stage comprising an envelope modulated power supply, the method comprising: determining a shaping function to be applied to an envelope signal for controlling the envelope modulated power supply in dependence on a system linearity objective in a region of operation of the amplifier in which the output power of the amplifier is dependent upon the supply voltage; and determining a pre-distortion function to be applied to an input signal to be amplified in dependence on a further linearity objective of the system, in a region of operation of the amplifier in which the output of the amplifier is dependent upon the input power to the amplifier.

The pre-distortion function may be determined after the shaping function is determined.

The linearity objective may be a high power linearity objective and the further linearity objective is a low power linearity objective.

The minimum voltage of the modulated power supply may be varied in dependence of the average power level.

The minimum voltage of the modulated power supply may be reduced as the average power level is reduced.

The invention also provides a method of controlling an envelope tracking amplification stage, comprising: generating an envelope signal representing the envelope of a signal to be amplified; determining a shaping function to be applied to an envelope signal for controlling the envelope modulated power supply in dependence on a system linearity objective, in a region of operation of the amplifier in which the output power of the amplifier is dependent upon the supply voltage; applying the determined shaping function to the envelope signal to generate a shaped envelope signal: providing the shaped envelope signal as an input signal to an envelope modulated power supply for an amplifier of the amplification stage; determining a pre-distortion function to be applied to an input signal to be amplified in dependence on a further linearity objective of the system, in a region of operation of the amplifier in which the output power of the amplifier is dependent upon the input power; and pre-distorting the signal to be amplified in an input signal path to the amplifier.

The invention also provides an envelope tracking amplification stage comprising an envelope modulated power supply and an amplifier, and further comprising: a shaping table adapted to store a shaping function to be applied to an envelope signal for controlling the envelope modulated power supply in dependence on a system linearity objective in a region of operation of the amplifier in which the output power of the amplifier is dependent upon the supply voltage; and a pre-distortion block adapted to store a pre-distortion function to be applied to an input signal to be amplified in dependence on a further linearity objective of the system, in a region of operation of the amplifier in which the output of the amplifier is dependent upon the input power to the amplifier.

The pre-distortion function may be determined after the shaping function is determined.

The linearity objective may be a high power linearity objective and the further linearity objective is a low power linearity objective.

There may still further be provided an envelope tracking amplification stage, comprising: an envelope signal generator for generating an envelope signal representing the envelope of a signal to be amplified; a shaping table for shaping the envelope signal in dependence on a system linearity objective in a region of operation of the amplifier in which the output power of the amplifier is dependent upon the supply voltage; an envelope modulated power supply for receiving the shaped envelope signal and generating a supply voltage; a power amplifier for receiving the supply voltage; and a pre-distortion block for pre-distorting an input signal to be amplified in dependence on a linearity objective of the system in a region of operation of the amplifier in which the output power of the amplifier is dependent upon the input power; wherein the pre-distorted signal is provided as an input to the amplifier.

BRIEF DESCRIPTION OF THE FIGURES

The invention is now described by way of reference to the accompanying Figures, in which.

DESCRIPTION OF THE PREFERRED EMBODIMENTS

The invention is now described by way of example with reference to exemplary arrangements. The invention is not limited to the details of any described arrangement unless expressly stated. Aspects of the exemplary arrangements may be implemented in different combinations, and the invention is not limited to a specific combination of features by virtue of the presentation of an exemplary combination for the purposes of explaining the invention.

Figure 1:
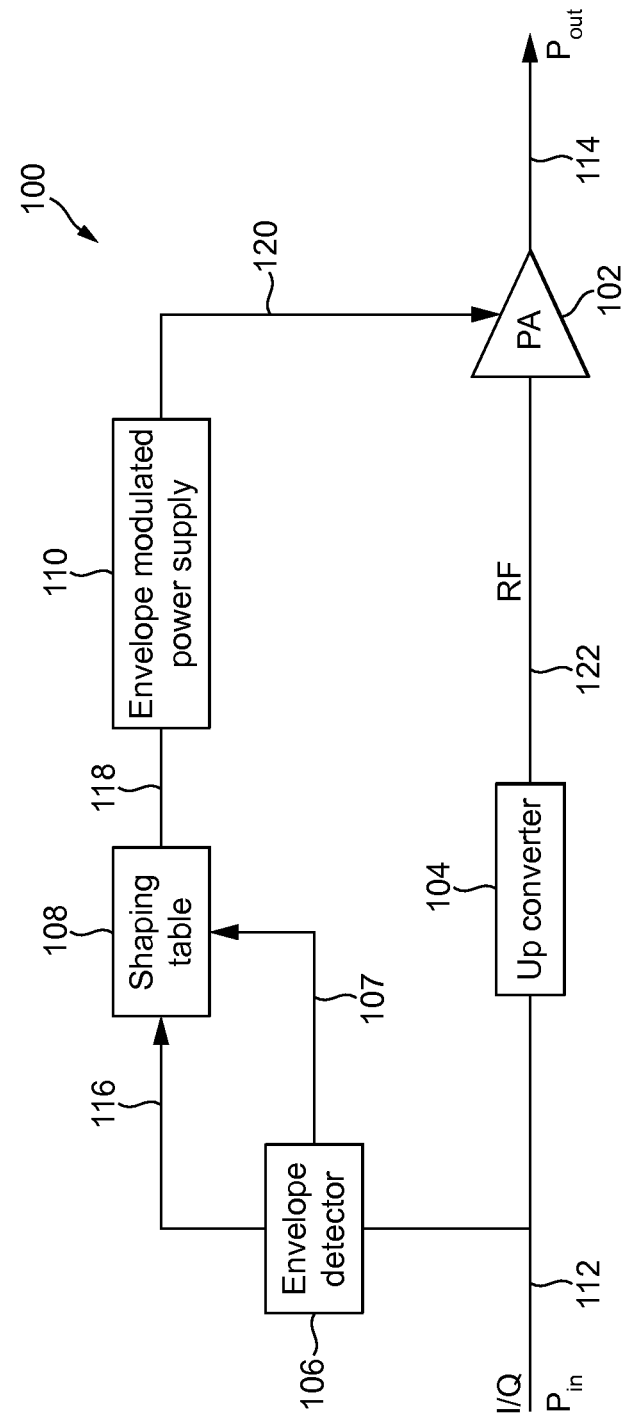
FIG. 1 illustrates an exemplary amplification system in which improvements in accordance with the invention and its embodiments may be implemented.

FIG. 1 illustrates an exemplary envelope tracking radio frequency (RF) power amplifier system 100 in which improvements in accordance with embodiments of the present invention may be implemented. The envelope tracking power amplifier system 100 includes a power amplifier 102, an up-converter 104, an envelope detector 106, a shaping table 108, and an envelope modulated power supply 110.

An input I/Q signal on line 112 forms an input to the up-converter 104, which generates an RF input signal for the RF power amplifier on line 122. The instantaneous power of the input I/Q signal is denoted $P_{IN}$. The input I/Q signal on line 112 also forms an input to the envelope detector 106, which generates an envelope signal representing the envelope of the input I/Q signal at its output on line 116. The envelope detector 106 additionally may generate, as illustrated in the arrangement of FIG. 1, a control signal on line 107 to the shaping table 108. In an alternative arrangement this control signal for the shaping table may be provided directly from baseband processing circuitry (not shown). The envelope signal on line 116 is provided as an input to the shaping table 108. The output of the shaping table on line 118 provides an input to the envelope modulated power supply, which in dependence thereon provides the supply voltage to the RF power amplifier on line 120. The RF power amplifier generates an amplified RF output signal at its output on line 114. The instantaneous power of the RF output signal is denoted $P_{OUT}$.

The up-converter 104 converts the input I/Q signal on line 112 into an RF signal for amplification. The envelope detector receives the I/Q signal on line 112, and generates an envelope signal at its output which represents the envelope of the input signal, i.e. provides a signal representing the magnitude of the envelope signal.

The implementation of the envelope modulated power supply 110 is outside the scope of the present invention, and one skilled in the art will appreciate that it may be implemented in a number of ways. Typically the envelope modulated power supply 110 includes a switched voltage supply in which one of a plurality of supply voltages can be selected in dependence on the instantaneous magnitude of the envelope signal provided by the shaping table. In an efficient amplification scheme, the selected supply voltage may then be further adjusted to provide a more accurate representation of the instantaneous envelope signal, before being provided to the RF power amplifier as the supply voltage. The invention is not limited to any specific implementation of an envelope modulated power supply.

The power amplifier 102 may be implemented as a single stage or multi-stage amplifier.

The shaping table 108 is a functional block for shaping the envelope signal, and applies a shaping function to the envelope signal on line 116 to provide a shaped envelope signal on line 118. The shaping function applied is determined by a control signal received—in the exemplary arrangement of Figure—from the envelope detector on line 107. The control signal may determine which shaping function, amongst a plurality of shaping functions, is applied to the envelope signal. The control signal may simply be a signal representing the average power of the I/Q input signal on line 112. The shaping of the envelope signal influences the efficiency and linearity of the power amplifier 102.

The amplification stage 100 is characterized in a pre-operation phase to determine the optimum instantaneous supply voltage level for a given input (I/Q) signal level in order to meet particular system objectives.

This characterization of the amplification stage 100 may require multiple power sweeps of the amplification stage. This characterization may include measurement of various power amplifier parameters, including supply voltage; bias voltage; RF gain; RF phase; supply current; RF input power; and RF output power.

In general, the parameters of the device are measured which are necessary to determine a particular performance characteristic or objective. If, for example, it is desired to optimise the gain of the amplification stage, then those parameters necessary to determine gain are measured for different input (envelope) signal and supply voltage combinations.

A measurement database for a given amplification stage may thus be established following a characterization process. The resulting measurement database can be used to predict the operational system performance of the device, based on the instantaneous input parameters and the choice of shaping function. In use, in dependence on a characteristic of an input signal to the amplifier, such as the average power of the input signal to the amplifier, the data obtained in the characterization operation is interrogated to determine the best shaping function to apply to the input signal to ensure the shaped envelope signal to the envelop modulated power supply is optimized for meeting the decided performance characteristic.

The characterization of the amplifier stage may be carried out in a number of ways, and the invention is not limited to a specific characterization technique. Most conveniently the characterization may be carried out using automated test equipment.

Figure 2:
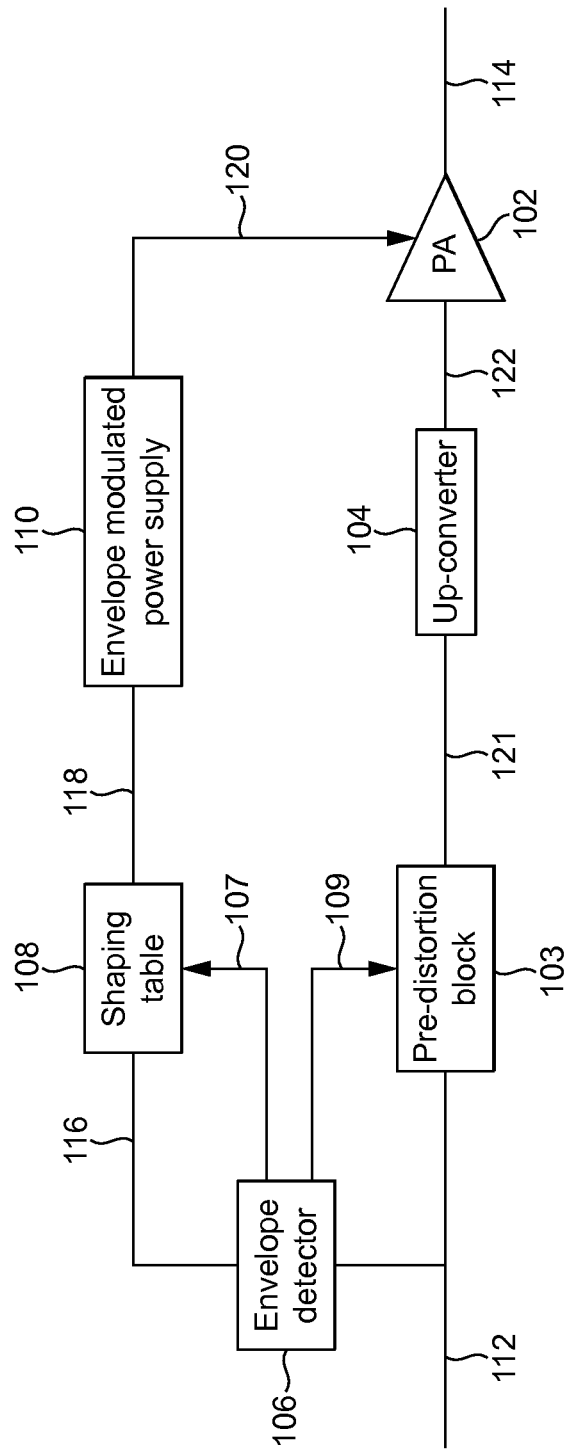
FIG. 2 illustrates an improved amplification system in accordance with an embodiment of the invention, incorporating a pre-distortion block in the RF input path.

FIG. 2 illustrates a modification to the exemplary power amplification system of FIG. 1 in accordance with the invention. The system is modified to include a pre-distortion block 103 in the RF input path prior to the up-converter 104. The input I/Q signals on line 112 provide an input to the pre-distortion block 103, and the pre-distortion block 103 provides an output signal on line 121 which forms the input to the up-converter 104. The pre-distortion block 103 receives a control signal representative of the average power of the input signal on line 109 from the envelope detector 106. In an alternative arrangement this control signal for the pre-distortion block may be provided directly from baseband processing circuitry (not shown). In an alternative arrangement, the input to the envelope detector block 106 may be derived from the output of the pre-distortion block 103, rather than provided directly by the input I/Q signal.

Figure 3:
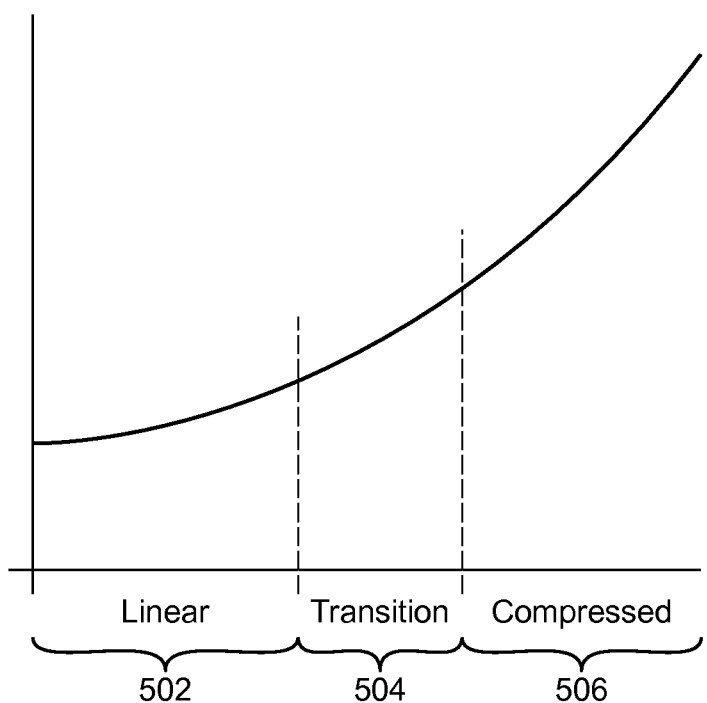
FIG. 3 illustrates the operating regions of an amplifier.

FIG. 3 illustrates the regions of operation of the power amplifier when operating in envelope tracking mode: the linear region 502, the transition region 504; and the compressed region 506. In the linear region 502, the output power of the power amplifier is determined by the input power, and the supply voltage has little influence. In the compressed region 506, the output power is determined by the supply voltage, and the input power has little influence. In the transition region 504 the output power is determined by both supply voltage and input power.

The pre-distortion block is configured to apply amplitude and phase correction to the input I/Q signals prior to up-conversion in order to pre-distort the input signal to the amplifier to compensate for distortion which is introduced in the amplification stage. More particularly, the pre-distortion block 103 is configured to adapt the I/Q signals prior to up-conversion in order to pre-distort the input signal to the amplifier to compensate for amplitude and phase distortion occurring at low instantaneous power.

Thus pre-distortion is applied before the up-converter 104 of FIG. 1, it is unable to do anything to address distortion in the compressed region, as the input power has little or no influence on output power. However, pre-distortion applied prior to the up-converter can correct distortion in the transition and linear regions, as input power does have an influence on output power in those regions.

Thus the pre-distortion block 103 can be used to control distortion, and linearity, in the linear and transition regions.

At the same time, in accordance with the invention, the shaping table is used to control linearity and hence distortion in the compressed region.

Thus: (i) the shaping table can be set for efficiency and linearity at high instantaneous power (i.e. distortion in the compressed region); and (ii) the pre-distortion block can be used for linearization in the transition and linear regions.

The invention has particularly advantageous applicability in handset implementations.

The invention is thus a shaping table in the envelope path and a pre-distortion stage in the RF path, wherein the shaping table is selected to optimize a particular system objective, and then the pre-distortion is adjusted to linearize the system.

With the provision of the pre-distortion block 103, an efficiency improvement can be provided over a system in which all amplitude linearization is performed by the envelope path shaping table. This is because the modulator swing range can be set to optimize efficiency and linearity in only the high power region.

If the power supply swing range is set only by efficiency considerations the maximum voltage is determined by the maximum peak power required and the minimum voltage should be set such that the majority of the signal power lies above the power corresponding to the minimum voltage.

Figure 4:
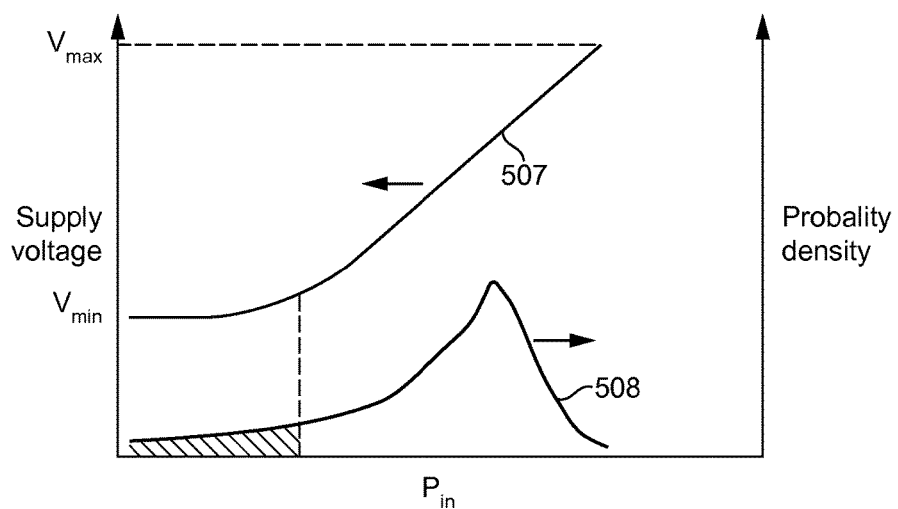
FIG. 4 illustrates a plot of supply voltage against input power in an exemplary arrangement.

This is illustrated in FIG. 4 which shows a shaping function 507 and the probability density of the signal 508. It can be seen that the majority of the power of the signal lies in the transition and compressed regions in which the envelope of the signal is tracked. From a power amplifier efficiency standpoint, there is little advantage in swinging to lower voltages as the energy in the lower power 'tail' of the power probability density function is low.

The overall solution efficiency (i.e. the efficiency of the combined power amplifier and modulator) is reduced if the swing range is excessive, as the modulator efficiency reduces with increasing swing range.

If linearization is implemented solely in the envelope path, the required swing range will be greater than if it is set by efficiency considerations alone.

Figure 5:
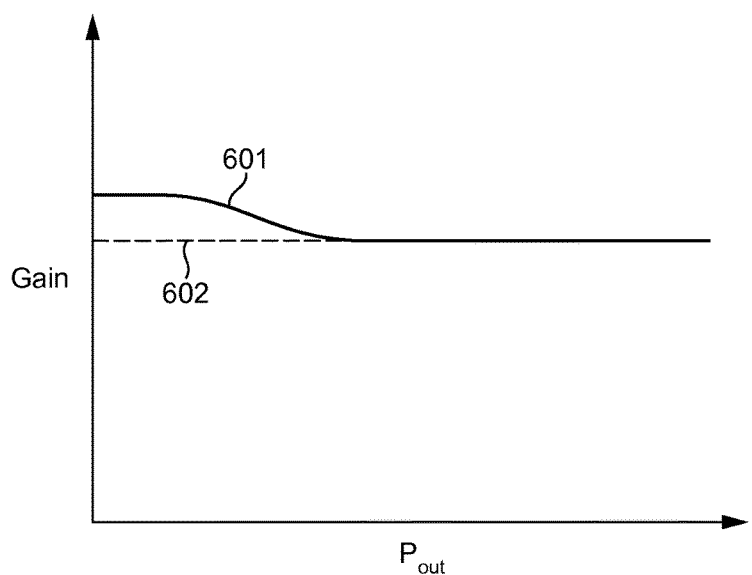
FIG. 5 illustrates a plot of gain against output power in an exemplary arrangement

The power amplifier gain associated with an isogain shaping function implemented with a large swing voltage is shown by 602 in FIG. 5. If the swing range is reduced to that required for optimum efficiency the gain increases at low power, as shown by trace 601. The use of pre-distortion in the RF path can be used to compensate for this low power non-linearity resulting in improved efficiency and good linearity simultaneously.

Thus in an embodiment the invention allows the swing range of the supply to be reduced, using the pre-distortion block 103 to compensate for any adverse impact on system linearity at low instantaneous power.

In an exemplary system set-up for characterizing the power amplifier in order to determine the data for the shaping table 108 and the pre-distortion block 103, the shaping table is first determined by consideration of efficiency and linearity objectives in the transition and compressed regions. Once the shaping function is determined, the appropriate I/Q path pre-distortion can be determined for linearity correction at low instantaneous power.

As noted above the invention is not concerned with the way in which the power amplifier is characterized but rather with the method of selection of values for the shaping table 108 and the pre-distortion block 103. Techniques for generating PA characterization data will be familiar to a skilled person.

Provision may be made for control signals to change a shaping function in the shaping table 108 and/or RF path pre-distortion in operation in dependence on the average power of the input signal The present invention may be implemented in any envelope tracking amplifier architecture. Such architectures may be found in mobile communications systems, in Wireless infrastructure or in mobile telephony devices (handsets).

The invention has been described herein by way of reference to particular examples and embodiments, which are useful for understanding the invention and understanding preferred implementations of the invention. The invention is not, however, limited to the specifics of any given embodi-

The invention claimed is:

1. A method for amplifying an input signal, comprising:
generating an envelope signal based on the input signal to be amplified by an amplifier;
shaping the envelope signal for controlling an envelope modulated power supply for the amplifier, wherein shaping the envelope signal is based on an indication of a power of the input signal, wherein shaping the envelope signal comprises adjusting a power supply voltage of the amplifier to track the envelope signal while maintaining the power supply voltage above a minimum voltage setting, wherein the power supply voltage is adjusted such that the power supply voltage only tracks the envelope signal while a voltage of the envelope signal is greater than the minimum voltage setting; and
pre-distorting the input signal to be amplified, wherein pre-distorting the input signal is based on the indication of the power of the input signal, wherein pre-distorting the input signal is based on a pre-distortion function and the shaping the envelope signal is based on a shaping function, and wherein the pre-distortion function is set to improve linearity within a linear region of power associated with the input signal and the shaping function is set to improve linearity within a compressed region of power associated with the input signal, wherein the compressed region of power is higher than the linear region of power.

2. The method of claim 1, wherein:
an output power of the amplifier in the linear region is more dependent on an input power of the amplifier with respect to the compressed region of power associated with the input signal; and
the output power of the amplifier in the compressed region is more dependent on a supply voltage of the amplifier with respect to the linear region of power.

3. The method of claim 1, wherein shaping the envelope signal comprises adjusting the minimum voltage setting based on an average power level of the input signal.

4. The method of claim 1, wherein shaping the envelope signal comprises reducing the minimum voltage setting as an average power level of the input signal is reduced.

5. An envelope tracking amplification stage, comprising:
an envelope detector configured to generate an envelope signal based on an input signal to be amplified by an amplifier;
a shaping table configured to shape the envelope signal for controlling an envelope modulated power supply for the amplifier, wherein the shaping table is configured to shape the envelope signal based on an indication of a power of the input signal, wherein shaping the envelope signal comprises adjusting a power supply voltage of the amplifier to track the envelope signal while maintaining the power supply voltage above a minimum voltage setting, wherein the power supply voltage is adjusted such that the power supply voltage only tracks the envelope signal while a voltage of the envelope signal is greater than the minimum voltage setting; and
a pre-distortion block configured to pre-distort the input signal to be amplified, wherein the pre-distortion block is configured to pre-distort the input signal based on the indication of the power of the input signal, wherein the pre-distortion block is configured to pre-distort the input signal based on a pre-distortion function and the shaping table is configured to shape the envelope signal based on a shaping function, and wherein the pre-distortion function is set to improve linearity within a linear region of power associated with the input signal and the shaping function is set to improve linearity within a compressed region of power associated with the input signal, wherein the compressed region of power is higher than the linear region of power.

6. The envelope tracking amplification stage of claim 5, wherein:
an output power of the amplifier in the linear region is more dependent on an input power of the amplifier with respect to the compressed region of power associated with the input signal; and
the output power of the amplifier in the compressed region is more dependent on a supply voltage of the amplifier with respect to the linear region of power.

7. The method of claim 1, wherein shaping the envelope signal is based on an average power of the input signal.

* * * * *